United States Patent
Lee

(10) Patent No.: US 11,114,492 B2
(45) Date of Patent: Sep. 7, 2021

(54) IMAGE SENSOR

(71) Applicant: SK hynix Inc., Icheon-si (KR)

(72) Inventor: Won-Jun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/123,232

(22) Filed: Sep. 6, 2018

(65) Prior Publication Data

US 2019/0148448 A1 May 16, 2019

(30) Foreign Application Priority Data

Nov. 13, 2017 (KR) .................. 10-2017-0150592

(51) Int. Cl.
*H01L 27/146* (2006.01)
*H04N 5/378* (2011.01)
*H01L 21/761* (2006.01)
*H01L 21/762* (2006.01)

(52) U.S. Cl.
CPC .... *H01L 27/14641* (2013.01); *H01L 27/1461* (2013.01); *H01L 27/1463* (2013.01); *H01L 27/1464* (2013.01); *H01L 27/14607* (2013.01); *H01L 27/14612* (2013.01); *H01L 27/14614* (2013.01); *H01L 27/14627* (2013.01); *H04N 5/378* (2013.01); *H01L 21/761* (2013.01); *H01L 21/76224* (2013.01); *H01L 27/14621* (2013.01); *H01L 27/14645* (2013.01); *H01L 27/14678* (2013.01); *H01L 27/14689* (2013.01)

(58) Field of Classification Search
CPC ......... H01L 27/14641; H01L 27/14607; H01L 27/1461; H01L 27/14612; H01L 27/1463
See application file for complete search history.

(56) References Cited

U.S. PATENT DOCUMENTS

| | | | |
|---|---|---|---|
| 8,338,868 B2 | 12/2012 | Mheen et al. | |
| 9,159,751 B2 | 10/2015 | Lee et al. | |
| 9,190,435 B2 | 11/2015 | Lin et al. | |
| 9,305,949 B2 | 4/2016 | Chen et al. | |
| 9,799,696 B1* | 10/2017 | Tai | H01L 27/1463 |
| 2005/0139833 A1* | 6/2005 | Janesick | H01L 27/1464 257/69 |
| 2010/0133590 A1* | 6/2010 | Mheen | H01L 27/14603 257/225 |
| 2016/0268322 A1 | 9/2016 | Watanabe et al. | |
| 2017/0047365 A1 | 2/2017 | Tatani et al. | |
| 2019/0237499 A1* | 8/2019 | Roy | H01L 27/14641 |

* cited by examiner

*Primary Examiner* — Sarah K Salerno
(74) *Attorney, Agent, or Firm* — Perkins Coie LLP

(57) ABSTRACT

An image sensor includes a photoelectric conversion element structured to receive incident light and convert the received light into electric charges; a plurality of transfer transistors electrically coupled to the photoelectric conversion element to respond to a transfer signal to selectively transfer the electric charges out of the photoelectric conversion element; and a lag prevention structure formed at a center of the photoelectric conversion element and structured to receive the transfer signal to operate together with the plurality of transfer transistors to facilitate transfer the electric charges out of the photoelectric conversion element.

18 Claims, 8 Drawing Sheets

IMAGE SENSOR

CROSS-REFERENCE TO RELATED APPLICATION

This patent document claims the priority and benefits of Korean Patent Application No. 10-2017-0150592 filed on Nov. 13, 2017 in the Korean Intellectual Property Office, the disclosure of which is incorporated herein by reference in its entirety.

TECHNICAL FIELD

Various embodiments generally relate to a semiconductor device fabrication technology, and more particularly, to an image sensor.

BACKGROUND

An image sensor is a device which receives light from an optical image or one or more objects and converts the received light into electrical signals forming an image. Recently, with the development of applications that use or are based on imaging from image sensors including the computer industry and communication industry, the demand for an image sensor having improved performance is increasing in various fields or applications, including, e.g., a digital camera, a camcorder, a portable device such as a personal communication system including a smart phone, a wearable device, a game machine, a security camera, a medical micro-camera and a robot.

SUMMARY

Various embodiments are directed to an image sensor with improved performance.

In an embodiment, an image sensor may include a photoelectric conversion element structured to receive incident light and convert the received light into electric charges; a plurality of transfer transistors electrically coupled to the photoelectric conversion element to respond to a transfer signal to selectively transfer the electric charges out of the photoelectric conversion element; and a lag prevention structure formed at a center of the photoelectric conversion element and structured to receive the transfer signal to operate together with the plurality of transfer transistors to facilitate transfer the electric charges out of the photoelectric conversion element.

The image sensor may further include a monochromatic color separation element overlapping with the photoelectric conversion element; and a plurality of light focusing elements formed over the color separation element, The number of the plurality of light focusing elements may be the same as the number of the plurality of transfer transistors.

The transfer signal may include a first transfer signal which is applied to the plurality of transfer transistors and a second transfer signal which is applied to the lag prevention structure, and the first transfer signal and the second transfer signal have different polarities from each other. The first transfer signal may include a positive voltage and the second transfer signal may include a negative voltage.

A planar shape of the lag prevention structure may be symmetrical with respect to the center of the photoelectric conversion element.

The lag prevention structure may include an impurity region which is formed in the photoelectric conversion element and has a pillar shape.

The impurity region may include a P-type impurity region. The lag prevention structure may further include an ohmic contact layer which is formed over the P-type impurity region.

The impurity region may include an N-type impurity region. The lag prevention structure may further include a gate which is formed over the N-type impurity region.

The plurality of transfer transistors may be positioned at corners of the photoelectric conversion element.

The plurality of transfer transistors is positioned symmetrically to one another with respect to the lag prevention structure.

In an embodiment, an image sensor may include a plurality of pixel blocks isolated by an isolation structure. Each of the plurality of pixel blocks may include a substrate having a first surface and a second surface that are on opposite side of the substrate, and the substrate including a photoelectric conversion element formed in the substrate; a plurality of transfer transistors formed over the first surface of the substrate, and coupled to the photoelectric conversion element; and a lag prevention structure formed in the photoelectric conversion element, and including an impurity region which is positioned at a center of the photoelectric conversion element.

Each of the plurality of pixel blocks may further include a monochromatic color separation element formed over the second surface of the substrate and overlapping with the photoelectric conversion element; and a plurality of light focusing elements formed over the color separation element. The number of the plurality of light focusing elements may be the same as the number of the plurality of transfer transistors.

The lag prevention structure may have the shape of a vertically extending pillar, and is brought into contact with the first surface of the substrate or the second surface of the substrate. A negative voltage is applied to the lag prevention structure.

The impurity region may include a P-type impurity region. The lag prevention structure may further include an ohmic contact layer which is formed over the P-type impurity region.

The impurity region may include an N-type impurity region. The lag prevention structure may further include a gate which is formed over the N-type impurity region.

A planar shape of the lag prevention structure may be symmetrical with respect to the center of the photoelectric conversion element.

The plurality of transfer transistors may be positioned symmetrically to one another with respect to the lag prevention structure.

Each of the plurality of pixel blocks may further include a plurality of floating diffusions electrically connected to the plurality of transfer transistors, respectively; and a driving section electrically coupled to at least one of the plurality of floating diffusions and structured to output an output signal corresponding to photocharges generated in the photoelectric conversion element.

The driving section of a corresponding pixel block may be electrically coupled with a first floating diffusion among the plurality of floating diffusions in the corresponding pixel block. Remaining floating diffusions except the first floating diffusion in the corresponding pixel block may be electrically coupled to driving sections of other pixel blocks adjacent to the corresponding pixel block.

In an embodiment, an image sensor may include a plurality of pixel blocks isolated by an isolation structure and including a first pixel block to a fourth pixel block which are positioned adjacent to one another among the plurality of pixel blocks and share a first floating diffusion. Each of the first pixel block to the fourth pixel block may include a photoelectric conversion element; a lag prevention structure formed at a center of the photoelectric conversion element; and a plurality of transfer transistors sharing the photoelectric conversion element. The first floating diffusion is electrically coupled to any one of the plurality of transfer transistors in each of the first pixel block to the fourth pixel block.

The image sensor may further include a color filter array formed to correspond to the plurality of pixel blocks, the color filter array including a Bayer pattern.

The lag prevention structures of the first pixel block to the fourth pixel block may be positioned symmetrically to one another with respect to the first floating diffusion.

The first pixel block to the fourth pixel block may surround the first floating diffusion and any two adjacent pixel blocks of the first pixel block to the fourth pixel block may further share an additional floating diffusion.

In the present technology, since a plurality of transfer transistors share a photoelectric conversion element, the fill factor of the photoelectric conversion element may be easily increased, and sensitivity may be improved.

Also, since a lag prevention structure which is formed at the center of the photoelectric conversion element may be included, the movement of the photocharges accumulated in the photoelectric conversion element may be easily controlled even though the size of the photoelectric conversion element may be increased.

Moreover, because the plurality of transfer transistors and the lag prevention structure operate in synchronization with transfer signals, an operation speed may be increased and the high integration of an image sensor may be easy.

DETAILED DESCRIPTION

Figure 1:
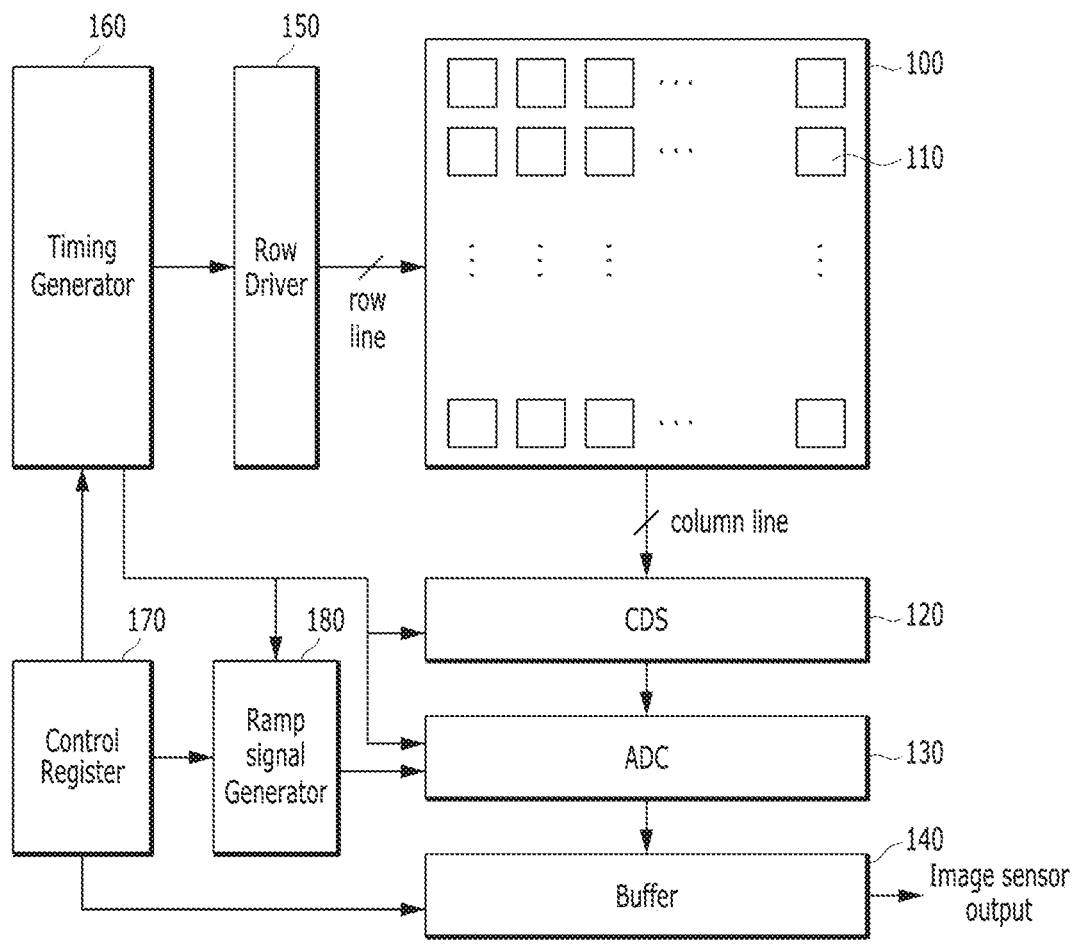
FIG. 1 is a block diagram schematically illustrating a representation of an example of an image sensor based on an implementation of the disclosed technology.

The following embodiments are to provide an image sensor with improved performance. The following embodiments provide an image sensor capable of preventing degradation in the imaging sensitivity due to a reduction in the size of a pixel, in particular, the size of a photoelectric conversion element, as the degree of integration of an image sensor is increased. Notably, a shared pixel structure can be used in an imaging sensor to prevent this undesired sensitivity degradation due to an increase in the degree of integration of an image sensor. In some implementations of a shared pixel structure, unit pixels are designed to have their respective photoelectric conversion elements in a corresponding pixel block of different unit pixels. Accordingly, in such implementations for the shared pixel structure, the different photoelectric conversion elements of the unit pixels need be isolated by an isolation structure and can be designed to share one floating diffusion. The presence of this isolation structure for isolating the different photoelectric conversion elements within one pixel block is a limitation to the desired increase in the fill factor which is represented by a ratio of an area occupied by the photosensing element with respect to an area occupied by peripheral circuitry for reading out an output of the photosensing element (for example, circuitry for resetting and outputting a sensed signal) because the area occupied by the isolation structure between the photoelectric conversion elements within each pixel block would not be available for enlarging the area of the photoelectric conversion elements. In this consideration, the following embodiments provide an image sensor designed to increase the fill factor. Implementations of the image sensor may have a shape in which a plurality of unit pixels share one photoelectric conversion element within each pixel block so that there is no need for having an isolation structure to isolate the plurality of unit pixels from one another within each pixel block. Thus, it is possible to significantly increase the fill factor of the photoelectric conversion element in comparison with the other shared pixel structures having different photoelectric conversion elements within each pixel block. Therefore, the size of a pixel, in particular, the size of a photoelectric conversion element, can increase even though the degree of integration of an image sensor increases, and through this, sensitivity of the images sensor can be improved.

The disclosed pixel array can be based on various semiconductor sensor structures including, for example, a complementary metal oxide semiconductor (CMOS) image sensor or CIS. A CIS sensor can include an array of pixel blocks each including a photosensor that converts received light into electric charges, which may be a photogate, a photodiode, a phototransistor, a photoconductor, or a photosensitive structure capable of generating photo-generated charges. Each pixel block can also include a charge storage region for storing the photo-generated charges, which may be constructed as a floating diffusion in some implementations. Additional circuitry may be included in each pixel block, e.g., a transfer transistor for transferring the photo-generated charges from the photosensor to the storage region and a reset circuitry for resetting the charges in the charge storage region after a readout.

FIG. 1 is a block diagram schematically illustrating a representation of an example of an image sensor in accordance with embodiments.

As shown in FIG. 1, the image sensor may include a pixel array 100 in which a plurality of pixel blocks 110 are arranged in a matrix structure including columns and rows, a correlated double sampling (CDS) 120, an analog-digital converter (ADC) 130, a buffer 140, a row driver 150, a timing generator 160, a control register 170, and a ramp signal generator 180. Each pixel block 110 of the pixel array 100 includes unit pixels (e.g., PX1 to PX4) which are arranged in columns and rows. Each pixel block 110 includes a photoelectric conversion element and readout circuitry for transferring charges of the photoelectric conversion element to out of the pixel block 110 as an output for the pixel block 110. Different pixel blocks 110 in rows and columns produce their respective outputs as the output of the pixel array 100 via the sampling circuitry 120 (e.g., a CDS circuit).

The timing generator 160 for the pixel array 100 generates one or more control signals for controlling the respective operations of the pixel array 100 via the operations of the row driver 150, the correlated double sampling 120, the analog-digital converter 130 and the ramp signal generator 180. The control register 170 generates one or more control signals for controlling the respective operations of the ramp signal generator 180, the timing generator 160 and the buffer 140.

The row driver 150 drives the pixel array 100 by the unit of row line. For example, the row driver 150 may generate a select signal for selecting any one row line among a plurality of row lines. Each of the plurality of row lines is coupled with a plurality of pixel blocks 110. Each of the plurality of pixel blocks 110 is coupled with one row line.

Each of the plurality of pixel blocks 110 senses incident light received by that pixel block 110, converts the sensed incident light, and outputs an image reset signal and an image signal to the correlated double sampling 120 through a column line. The correlated double sampling 120 performs sampling for each of the image reset signal and the image signal received therein from each pixel block 110. Each of a plurality of column lines is coupled with a plurality of pixel blocks 110. Each of the plurality of pixel blocks 110 is coupled with one column line. The analog-digital converter 130 compares a ramp signal which is outputted from the ramp signal generator 180 and a sampling signal which is outputted from the correlated double sampling 120, and outputs a comparison signal. The analog-digital converter 130 counts a level transition time of the comparison signal according to a clock signal which is provided from the timing generator 160, and outputs a count value to the buffer 140. The ramp signal generator 180 may operate under control of the timing generator 160.

The buffer 140 stores a plurality of digital signals which are outputted from the analog-digital converter 130, senses and amplifies the respective digital signals, and outputs resultant signals. Thus, the buffer 140 may include a memory (not shown) and a sense amplifier (not shown). The memory is to store count values, and the count values mean the count values associated with the signals outputted from the plurality of pixel blocks 110. The sense amplifier senses and amplifies the respective count values which are outputted from the memory.

Figure 2:
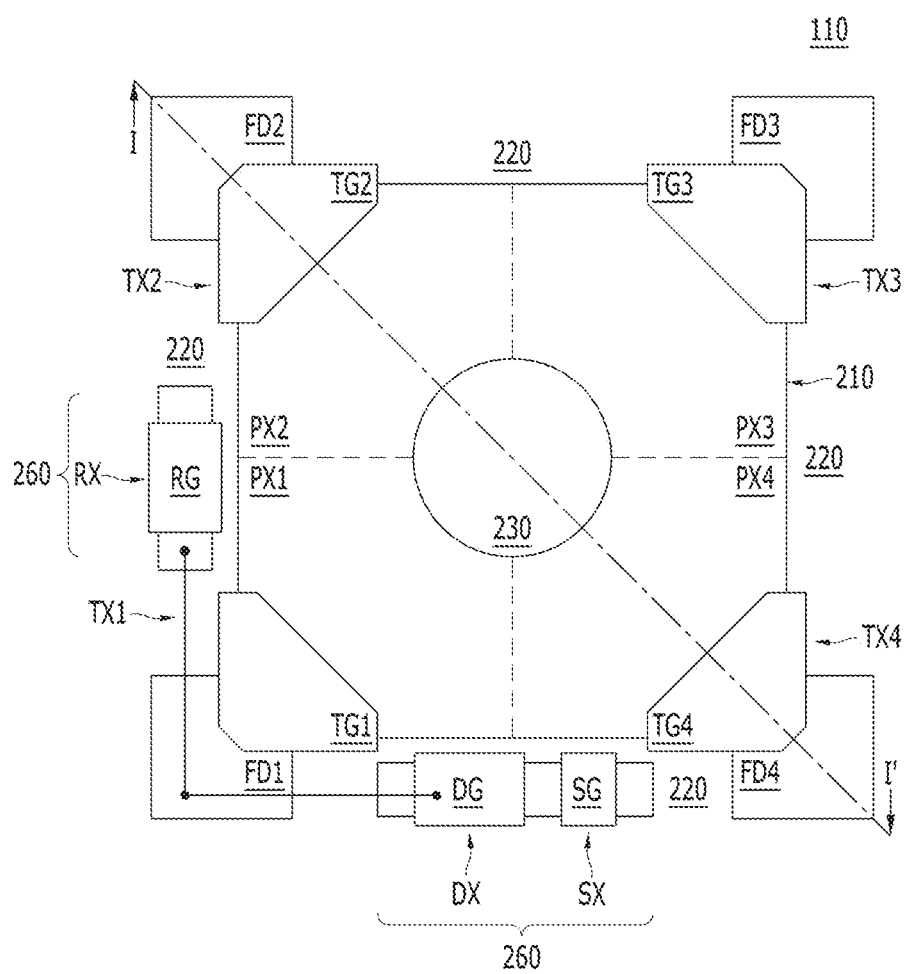
FIG. 2 is a top view illustrating a representation of an example of the pixel block of an image sensor based on an implementation of the disclosed technology.
Figure 3:
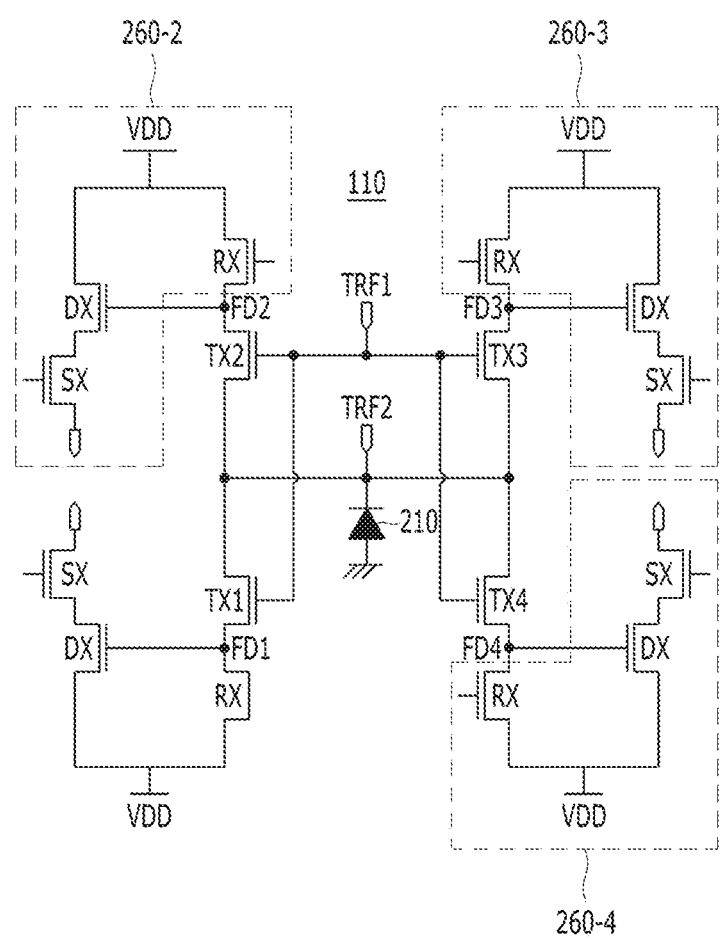
FIG. 3 is an equivalent circuit diagram illustrating a representation of an example of the pixel block of the image sensor based on an implementation of the disclosed technology.
Figure 4A:
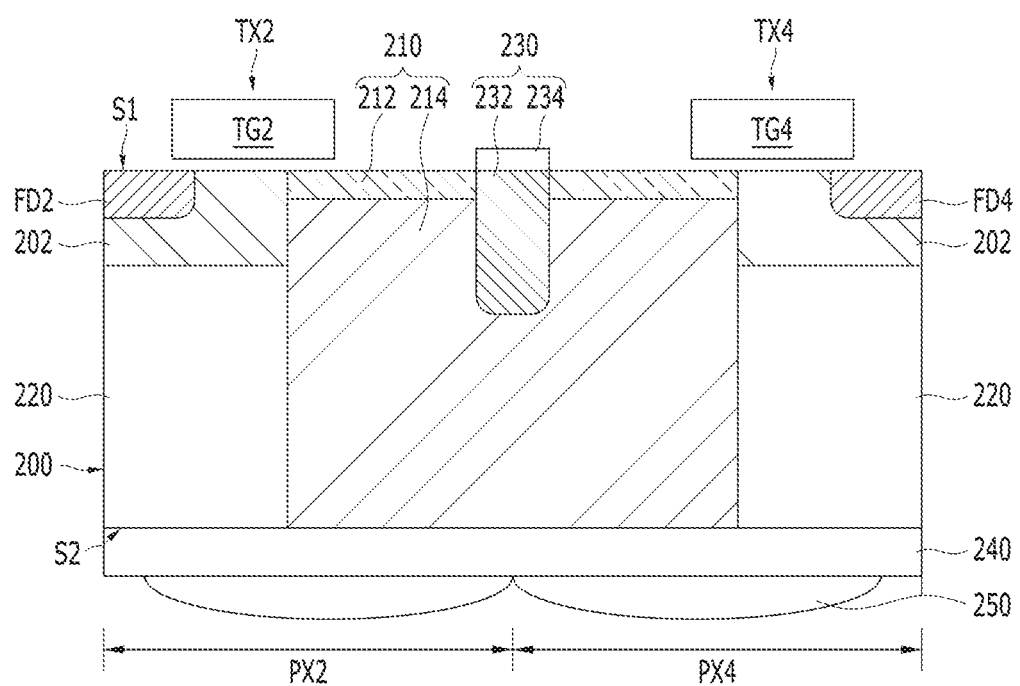
FIG. 4A is a cross-sectional view taken along the line I-I' of FIG. 2, illustrating a representation of an example of the pixel block of the image sensor based on an implementation of the disclosed technology.
Figure 4B:
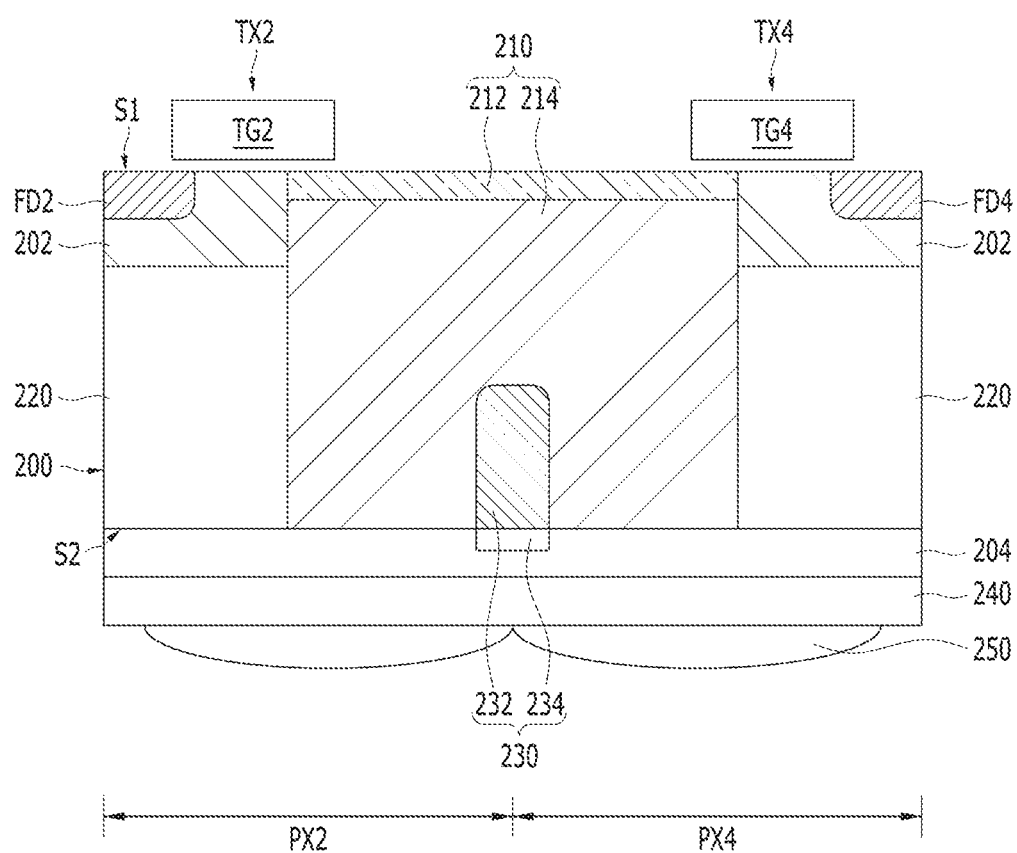
FIG. 4B is a cross-sectional view taken along the line I-I' of FIG. 2, illustrating a representation of an example of a modification of the pixel block of the image sensor based on an implementation of the disclosed technology.

FIGS. 2 and 3 illustrate a representation of an example of a pixel block of an image sensor in accordance with a first embodiment, wherein FIG. 2 is a top view and FIG. 3 is an equivalent circuit diagram of the pixel block. FIG. 4A is a cross-sectional view taken along the line I-I' of FIG. 2, illustrating a representation of an example of the pixel block of the image sensor in accordance with the first embodiment. FIG. 4B is a cross-sectional view of another example of a pixel block based on implementations of the disclosed technology.

As shown in FIGS. 2, 3 and 4A, the pixel array (see the reference numeral 100 of FIGS. 1 and 6) of the image sensor in accordance with the first embodiment may include a plurality of pixel blocks 110 which are isolated by an isolation structure 220 formed outside each pixel block 110 and between different pixel blocks 110. There is no isolation structure within each pixel block due to the single photoelectric conversion element construction for different unit pixels PX1 to PX4 within each pixel block 110. The pixel block 110 may include a plurality of unit pixels PX1 to PX4. The first embodiment illustrates a case where one pixel block 110 includes four unit pixels PX1 to PX4.

Each of the plurality of pixel blocks 110 may include a single and large photoelectric conversion element 210 that is designed to occupy as much area as practically possible within each pixel block 110, a lag prevention structure 230 which is formed at the center of the photoelectric conversion element 210, and a plurality of transfer transistors TX1 to TX4 which share the photoelectric conversion element 210 by coupling to it to transfer photo-induced charges in the same photoelectric conversion element 210 to different floating diffusions FD1 to FD4 which correspond to the plurality of transfer transistors TX1 to TX4, respectively. Due to this implementation of one single large photoelectric conversion element 210 within each pixel block 110 shared by the four different unit pixels in the pixel block 110, there is no need to include an isolation structure for separating or isolating different photoelectric conversion elements in different unit pixels within one pixel block in other designs. In this embodiment, a driving section 260 may be provided in each pixel block 110 to generate and output an image signal and an image reset signal corresponding to the photocharges generated in the photoelectric conversion element 210. The plurality of transfer transistors TX1 to TX4 and the lag prevention structure 230 may operate in synchronization with transfer signals TRF1 and TRF2 to increase the charge transfer from the photoelectric conversion element 210 to the floating diffusions FD1 to FD4. The transfer signals TRF1 and TRF2 may include a first transfer signal TRF1 which is applied to gates of the plurality of transfer transistors TX1 to TX4 and a second transfer signal TRF2 which is applied to the lag prevention structure 230 to move the photo-induced changes in the photoelectric conversion element 210 to the floating diffusions FD1 to FD4.

The first embodiment illustrates a case where four transfer transistors TX1 to TX4, that is, a first transfer transistor TX1 to a fourth transfer transistor TX4, share one photoelectric conversion element 210. The photoelectric conversion element 210 of each the pixel block 110 captures incident light and converts the captured light into an electric charge. The electric charge may be selectively transferred from the photoelectric conversion element 210 to floating diffusions FD via transfer transistors TX. The plurality of floating diffusions FD1 to FD4 may include a first floating diffusion FD1 to a fourth floating diffusion FD4 corresponding to the first transfer transistor TX1 to the fourth transfer transistor TX4, respectively.

In the image sensor in accordance with the first embodiment, one pixel block 110 may include four unit pixels PX1 to PX4. In the art, a 4-shared pixel structure has been known in which one pixel group includes four unit pixels and four photoelectric conversion elements. The conventional 4-shared pixel structure has been used for reducing a pixel size and enhancing a fill factor. Unlike the examples of the disclosed technology where the four unit pixels PX1 to PX4 share the photoelectric conversion element 210, the 4-shared pixel structure includes four photoelectric conversion elements which share a floating diffusion and isolated by an isolation structure. Since the 4-shared pixel structure requires four photoelectric conversion elements, there are limitations to increase a fill factor and it is difficult to increase a fill factor as much as needed. In the first embodiment in FIG. 2, the pixel block 110 has a shape in which four unit pixels PX1 to PX4 share one photoelectric conversion element 210, it is possible to easily and effectively increase a fill factor in comparison with the 4-shared pixel structure known in the art. Therefore, the size of a pixel, in particular, the size of the photoelectric conversion element 210, can be increased even though the degree of integration of an image sensor is increased, which makes it possible to improve sensitivity of the image sensor.

Hereafter, detailed descriptions will be made for respective components configuring the pixel block 110 of the image sensor in accordance with the first embodiment.

In the image sensor in accordance with the first embodiment, the photoelectric conversion element 210 and the isolation structure 220 may be ones which are formed in a substrate 200. A well 202 and the plurality of floating diffusions FD1 to FD4 may be also formed in the substrate 200. The well 202 for providing spaces in which the channels of the plurality of transfer transistors TX1 to TX4 and the plurality of floating diffusions FD1 to FD4 are to be formed may include doping of a first conductivity type such as a P-type impurity. The well 202 may be formed by doping p-type impurities into the substrate 200. The P-type impurity may be or include boron (B). The plurality of floating diffusions FD1 to FD4 may be formed in the well 202 and have a conductivity type that is complementary to the well 202. In some implementations, the plurality of floating diffusions FD1 to FD4 may include a second conductivity type, e.g., an N-type impurity and formed by doping N-type impurities into the substrate 200. The N-type impurity may be arsenic (As) or phosphorus (P).

The substrate 200 may have a first surface S1 and a second surface S2 that are on opposite sides of the substrate 200. For example, the first surface S1 may be a frontside and the second surface S2 may be a backside. The substrate 200 may include a semiconductor substrate. The semiconductor substrate may be a single crystalline state and include a silicon-containing material. In other words, the substrate 200 may include a single crystalline silicon-containing material. The substrate 200 may be or include a substrate which is thinned through a thinning process or a substrate which includes an epi layer formed through epitaxial growth.

The photoelectric conversion element 210 may include a photodiode, a photo transistor, or a photo gate or combinations thereof. For example, the photoelectric conversion element 210 may include a photodiode. In some implementations, the photoelectric conversion element 210 may have a shape in which a first region 212 and a second region 214 formed in the substrate 200 and having conductivity types complementary to each other are stacked in a vertical direction between the first surface S1 and the second surface S2 of the substrate. See FIG. 4A. In one implementation, the first region 212 may be a region which is formed to exhibit a first conductivity type such as a P-type impurity by doping P-type impurities into the substrate 200, and the second region 214 may be a region which is formed to exhibit a second conductivity type such as an N-type impurity by doping N-type impurities into the substrate 200. The doping impurities of the first region 212 and the second region 214 can be changed in different manner such that the first region 212 includes a N-type impurity and the second region 214 includes a P-type impurity. The second region 214 may have a thickness larger than the first region 212, and the first region 212 may be abut with the first surface S1 of the substrate 200.

The planar shape of the photoelectric conversion element 210 may have various shapes including a polygon such as a triangle, a quadrangle, or a hexagon or a circle. In the first embodiment, as one pixel block 110 may be configured by four unit pixels PX1 to PX4, since the photoelectric conversion element 210 are arranged in four unit pixels Px1 to PX4, the planar shape of the photoelectric conversion element 210 may be the shape of a quadrangle. The planar shape of the photoelectric conversion element 210 may be varied depending on the number of unit pixels PX1 to PX4 included in the pixel block 110. For example, in the case where the pixel block 110 includes six unit pixels, the planar shape of the photoelectric conversion element 210 may be the shape of a hexagon.

The isolation structure 220 may be to isolate adjacent pixel blocks 110, for example, adjacent photoelectric conversion elements 210. In some implementations, the isolation structure 220 may be formed in the substrate 200 and helps to define a region for the photo electric conversion element 210. In the exemplary image sensor based on the first embodiment, the isolation structure 220 may be formed below the well 220. The isolation structure 220 may include an STI (shallow trench isolation), a DTI (deep trench isolation) or a potential barrier. The potential barrier may be a region which is formed to include an impurity doped into the substrate 200. For example, the potential barrier may be a region which is formed to include a P-type impurity doped into the substrate 200. The isolation structure 220 may be constructed by any one or a combination of at least two including an STI, a DTI or a potential barrier. The first embodiment illustrates a case where the isolation structure 220 includes a potential barrier, for example, a region which is doped with a P-type impurity. In this case, the isolation structure 220 may have the same conductivity type as the well 202 and may have a doping concentration lower than the well 202.

In the image sensor in accordance with the first embodiment, the pixel block 110 includes four transfer transistors TX1 to TX4 which transfer photoelectrons generated from the photoelectric conversion element 210 to the floating diffusion FD. Each of the plurality of transfer transistors TX1 to TX4, that is, the first transfer transistor TX1 to the fourth transfer transistor TX4, may be positioned at the corner of the photoelectric conversion element 210. For example, the first transfer transistor TX1 may be positioned at the left lower corner, the second transfer transistor TX2 may be positioned at the left upper corner, the third transfer transistor TX3 may be positioned at the right upper corner, and the fourth transfer transistor TX4 may be positioned at the right lower corner. In the exemplary implementation, the arrangement of the first to fourth transfer transistors TX1 to TX4 may be symmetric with respect to a center of the photoelectric conversion element 210. This arrangement of the transfer transistors provides spaces for forming the driving section 260 and allows adjacent pixel blocks 110 to easily share the floating diffusions FD1 to FD4. A method for sharing the floating diffusions FD1 to FD4 between adjacent pixel blocks 110 will be described later with reference to FIG. 6. While the first embodiment illustrates a case where the plurality of transfer transistors TX1 to TX4 are positioned at the corners, respectively, of the photoelectric conversion element 210, it is to be noted that the embodiment is not limited thereto. As a modification, the plurality of transfer transistors TX1 to TX4 may be positioned at the sides, respectively, of the photoelectric conversion element 210, for example, between the corners of the photoelectric conversion element 210.

The first transfer transistor TX1 may include a first transfer gate TG1 which is formed over the first surface S1 of the substrate 200 and has portions which overlap with a portion of the photoelectric conversion element 210 and a portion of the first floating diffusion FD1, respectively. The image sensor can suffer from a phenomenon known as a lag. The lag can result from various reasons including an incomplete charge transfer from a photo electric conversion element and others. In order to prevent the occurrence of a lag, an area where the photoelectric conversion element 210 and the first transfer gate TG1 overlap with each other may be larger than an area where the first floating diffusion FD1 and the first transfer gate TG1 overlap with each other. The first transfer signal TRF1 may be applied to the first transfer gate TG1, and the photoelectric conversion element 210 and the first floating diffusion FD1 may serve as the source and the drain, respectively, of the first transfer transistor TX1. The first floating diffusion FD1 which is coupled to the first transfer transistor TX1 may be electrically coupled with the driving section 260 of the pixel block 110 to reset an electric potential of the first floating diffusion FD1 of the pixel block 110. The driving section 260, to which the first floating diffusion FD1 may be electrically coupled, may be located to control the reset transistor RX of the pixel block 110 and selectively reset charges accumulated in the first floating diffusion FD1 to a reference voltage level.

The second transfer transistor TX2 may include a second transfer gate TG2 which is formed over the first surface S1 of the substrate 200 and has portions which overlap with a portion of the photoelectric conversion element 210 and a portion of the second floating diffusion FD2, respectively. In order to prevent the occurrence of a lag, an area where the photoelectric conversion element 210 and the second transfer gate TG2 overlap with each other may be larger than an area where the second floating diffusion FD2 and the second transfer gate TG2 overlap with each other. The first transfer signal TRF1 may be applied to the second transfer gate TG2, and the photoelectric conversion element 210 and the second floating diffusion FD2 may serve as the source and the drain, respectively, of the second transfer transistor TX2. In order to operate based on the first transfer signal TRF1, the first transfer gate TG1 and the second transfer gate TG2 may be electrically coupled to each other. The second floating diffusion FD2 may be electrically coupled to the driving section (see the reference numeral 260-2 of FIG. 3) of another pixel block 110 adjacent to the pixel block 110 including the second transfer transistor TX2. For example, the second floating diffusion FD2 may be electrically coupled to the driving section 260 of another pixel block positioned adjacent to the pixel block 110 in a first direction. In the implementation, the first direction may be the direction along which the second unit pixel PX2 and the first unit pixel PX1 are arranged (see FIG. 6). The second floating diffusion FD2 may be not electrically coupled to the driving section of the pixel block 110 including the second transfer transistor TX2.

The third transfer transistor TX3 may include a third transfer gate TG3 which is formed over the first surface S1 of the substrate 200 and has portions which overlap with a portion of the photoelectric conversion element 210 and a portion of the third floating diffusion FD3, respectively. In order to prevent the occurrence of a lag, an area where the photoelectric conversion element 210 and the third transfer gate TG3 overlap with each other may be larger than an area where the third floating diffusion FD3 and the third transfer gate TG3 overlap with each other. The first transfer signal TRF1 may be applied to the third transfer gate TG3, and the photoelectric conversion element 210 and the third floating diffusion FD3 may serve as the source and the drain, respectively, of the third transfer transistor TX3. In order to operate based on the first transfer signal TRF1, the first transfer gate TG1 to the third transfer gate TG3 may be electrically coupled with one another. The third floating diffusion FD3 which is coupled to the third transfer transistor TX3 may be electrically coupled to the driving section (see the reference numeral 260-3 of FIG. 3) of another pixel block 110 adjacent to the pixel block 110 including the third transfer transistor TX3. For example, the third floating diffusion FD3 may be electrically coupled to the driving section 260 of another pixel block positioned adjacent to the pixel block 110 along a second direction. In the implementation, the second direction may be the direction along which the third unit pixel PX3 and the first unit pixel PX1 are arranged (see FIG. 6). The third floating diffusion FD3 may be not electrically coupled to the driving section of the pixel block 110 including the third transfer transistor TX3.

The fourth transfer transistor TX4 may include a fourth transfer gate TG4 which is formed over the first surface S1 of the substrate 200 and has portions which overlap with a portion of the photoelectric conversion element 210 and a portion of the fourth floating diffusion FD4, respectively. In order to prevent the occurrence of a lag, an area where the photoelectric conversion element 210 and the fourth transfer gate TG4 overlap with each other may be larger than an area where the fourth floating diffusion FD4 and the fourth transfer gate TG4 overlap with each other. The first transfer signal TRF1 may be applied to the fourth transfer gate TG4, and the photoelectric conversion element 210 and the fourth floating diffusion FD4 may serve as the source and the drain, respectively, of the fourth transfer transistor TX4. In order to operate based on the first transfer signal TRF1, the first transfer gate TG1 to the fourth transfer gate TG4 may be electrically coupled with one another. The fourth floating diffusion FD4 may be electrically coupled to the driving section (see the reference numeral 260-4 of FIG. 3) of another pixel block adjacent to the pixel block 110 including the fourth transfer transistor TX4. For example, the fourth floating diffusion FD4 may be electrically coupled to the driving section 260 of another pixel block positioned adjacent to the pixel block 110 in a third direction. In the implementation, the third direction may be the direction along which the second unit pixel PX2 and the fourth unit pixel PX4 are arranged (see FIG. 6). The fourth floating diffusion FD4 may be not electrically coupled to the driving section of the pixel block 110 including the fourth transfer transistor TX4.

In the image sensor in accordance with the first embodiment, the plurality of transfer transistors TX1 to TX4 may transfer the photocharges generated in the photoelectric conversion element 210, to the plurality of floating diffusions FD1 to FD4, respectively, in response to the first transfer signal TRF1. The first transfer signal TRF1 applied to the first transfer gate TG1 to the fourth transfer gate TG4 may be a positive signal, for example, a positive voltage. The plurality of transfer transistors TX1 to TX4 may operate based on the first transfer signal TRF1. In some implementations, the first transfer transistor TX1 to the fourth transfer transistor TX4 may simultaneously operate in response to the first transfer signal TRF1, and may transfer the photocharges generated in one photoelectric conversion element 210, to the first floating diffusion FD1 to the fourth floating diffusion FD4. Thus, when the amount of the photocharges generated in one photoelectric conversion element 210 may be 4000e, an amount of photocharges to be transferred to each of the first floating diffusion FD1 to the fourth floating diffusion FD4 may be 1000e. In order to ensure that the amounts of photocharges to be transferred to each of the first floating diffusion FD1 to the fourth floating diffusion FD4 are substantially the same, the first transfer transistor TX1 to the fourth transfer transistor TX4 may be positioned symmetrically with respect to the lag prevention structure 230.

In the image sensor in accordance with the first embodiment, the driving section 260 may be positioned adjacent to the photoelectric conversion element 210. In the implementation of FIG. 3, the driving section 260 may include first to fourth driving sections 260-1 to 260-4 electrically coupled to the first to fourth floating diffusions FD1 to FD4, respectively. Each of the driving section 260 may include a plurality of pixel transistors. The plurality of pixel transistors may include a reset transistor RX, a driver transistor DX and a select transistor SX. In the first embodiment as shown in FIG. 2, the driving section 260-1 may be positioned adjacent to the photoelectric conversion element 210, for example, the reset transistor RX of the driving section 260-1 may be located between two floating diffusions FD1 and FD2 and the driver transistor DX and the select transistor SX may be located between to the floating diffusions FD1 and FD4. In some implementations, the driving section 260 may be formed between adjacent photoelectric conversion elements 210. It is to be noted that the embodiment is not limited thereto and the arrangement of the driving sections 260-1 to 260-4 can be modified in various manners. As a modification, the driving section 260 may overlap with the photoelectric conversion element 210. While the first embodiment illustrates a case where the reset transistor RX, the driver transistor DX and the select transistor SX are formed in different active regions, it is to be noted that they may be formed in one active region.

The transfer transistors TX1 to TX4 and the photoelectric conversion element 210 may be connected in series between the corresponding floating diffusions FD1 to FD4 and a reference potential (e.g., ground). The first transfer signal TRF1 may be applied to the gates of the transfer transistors TX1 to TX4 to control the operations of the transfer transistors TX1 to TX4. The reset transistor RX, the driver transistor DX and the select transistor SX which configure the driving section 260 may include a reset gate RG, a driver gate DG and a select gate SG, respectively. In operation, the photoelectric conversion element 210 of the pixel block 110 may capture incident light and convert the captured light into an electric charge. Under the control of the first transfer signal TRF1, the electric charges may be selectively transferred from the photoelectric conversion element 210 to the floating diffusions FD1 to FD4 via the transfer transistors TX1 to TX4. The reset transistor RX may initialize a floating diffusion in response to a reset signal which may be applied to the reset gate RG. Upon receiving the reset signal, the reset transistor RX may selectively reset charges accumulated in the floating diffusions FD1 to FD4 to a reference voltage level (e.g., VDD). A power supply voltage VDD may be coupled to the drain of the reset transistor RX, and a floating diffusion may be coupled to the source of the reset transistor RX. The driver transistors DX may be connected to the floating diffusions FD1 to FD4. The driver transistor DX may generate or provide output signals corresponding to the amount of the photocharges stored in the floating diffusions FD1 to FD4, for example, an image signal and an image reset signal. The power supply voltage VDD may be coupled to the drain of the driver transistor DX, and the drain of the select transistor SX may be coupled to the source of the driver transistor DX. The select transistor SX operates to receive a select signal and selectively transfer the output voltage to a selected line. The select transistor SX may output the output signals generated or provided from the driver transistor DX, to a column line (not shown). A row line (not shown) extending from a row driver (see the reference numeral 150 of FIG. 1) may be coupled to the select gate SG, and a column line (not shown) extending from a correlated double sampling (see the reference numeral 120 of FIG. 1) may be coupled to the source of the select transistor SX.

Since the image sensor in accordance with the first embodiment has the shape in which the plurality of unit pixels PX1 to PX4 share one photoelectric conversion element 210, an image lag can occur and thus, the lag prevention structure 230 may be provided to prevent or reduce the occurrence of the image lag. This is because the area of the photoelectric conversion element 210 may be several times larger in comparison with the conventional shared pixel structure, which makes difficult to control the movement of the photocharges accumulated in the photoelectric conversion element 210. When the second transfer signal TRF is applied to the lag prevention structure 230, the photocharges accumulated in the photoelectric conversion element 210 can be pushed from the lag prevent structure 230 by an electric repulsion force and effectively transferred to the floating diffusions FD1 to FD4. Therefore, the lag prevention structure 230 can play the role of improving transfer capability for the photocharges accumulated in the photoelectric conversion element 210 when the plurality of transfer transistors TX1 to TX4 operate by being synchronized in response to the first transfer signal TRF1 applied to the gates of the transfer transistors TX1 to TX4 at the same time as shown in FIG. 3. In some implementations, the lag prevention structure 230 may be structured to control photocharges not to remain in the photoelectric conversion element 210 at the time when the operations of the plurality of transfer transistors TX1 to TX4 are completed. Thus, the lag prevention structure 230 can improve efficiency of movements of the photocharges accumulated in the photoelectric conversion element 210 to the respective transfer transistors TX1 to TX4 and also control the amounts of photocharges moved to each transfer transistor TX1 to TX 4 to be substantially same as one another. Through this design of the lag prevention structure 230, an operation speed may be increased, the uniformity among the unit pixels PX1 to PX4 may be improved, and the occurrence of a lag may be prevented.

The lag prevention structure 230 may operate together with the plurality of transfer transistors TX1 to TX4 in response to the second transfer signal TRF2. As shown in FIG. 3, the second transfer signal TRF2 is directly or capacitively supplied to the photoelectric conversion element 210. Thus, at a time when the plurality of transfer transistors TX1 to TX4 simultaneously operate in response to the first transfer signal TRF1, the lag prevention structure 230 may operate simultaneously with the plurality of transfer transistors TX1 to TX4 in response to the second transfer signal TRF2. In order to easily control the movement of the photocharges accumulated in the photoelectric conversion element 210, the second transfer signal TRF2 may have a polarity different from the first transfer signal TRF1. For example, the second transfer signal TRF2 may be a negative signal, for example, a negative voltage.

The lag prevention structure 230 may be positioned at the center of the photoelectric conversion element 210. The lag prevention structure 230 may include an impurity region 232 which is formed in the photoelectric conversion element 210 and an ohmic contact layer 234 which is formed on the impurity region 232. In some implementations, the impurity region 232 may have a pillar shape but other implementations are also possible. Referring to FIG. 4A, lag prevention structure 230 may extend along a direction from the first surface S1 to the second surface S2 of the substrate 200. The ohmic contact layer 234 may be brought into direct contact with the impurity region 232, and may include a metal silicide. The impurity region 232 may include a P-type impurity and be formed by doping P-type impurities into the substrate 200. This is to control the photocharges accumulated in the photoelectric conversion element 210 to move in the outward direction of the lag prevention structure 230 in response to the second transfer signal TRF2 which has a negative voltage. In order to ensure easy movement of photocharges to the respective transfer transistors TX1 to TX4, the thickness (or depth) of the impurity region 232 may be larger than the thickness of the first region 212 of the photoelectric conversion element 210 and may be equal to or smaller than one half of the entire thickness of the photoelectric conversion element 210. While the first embodiment illustrates a case where the impurity region 232 may abut with the first surface S1 of the substrate 200 and has the shape of a vertically extending pillar, it is to be noted that the embodiment is not limited thereto. As a modification, as shown in FIG. 4B, the impurity region 232 may be formed closer to the second surface S2 than the first surface S1 of the substrate 200. In FIG. 4B, the impurity region 232 may be abut with the second surface S2 of the substrate 200. The ohmic contact layer 234 may also be abut with the second surface S2 of the substrate 200, and a dielectric layer 204 which covers the ohmic contact layer 234 may be formed on the second surface S2 of the substrate 200.

The planar shape of the lag prevention structure 230 may be the shape of a polygon such as a triangle, a cross, an ellipse or a circle. In order to ensure that the amounts of the photocharges moved to the respective transfer transistors TX1 to TX4 are the same, the planar shape of the lag prevention structure 230 may be symmetrical based on the center of the photoelectric conversion element 210. For instance, the planar shape of the lag prevention structure 230 may be circular.

In the image sensor in accordance with the first embodiment, each of the plurality of pixel blocks 110 may include a color separation element 240 which is formed on the second surface S2 of the substrate 200 and has an area corresponding to the pixel block 110 and a plurality of light focusing elements 250 which are formed on the color separation element 240 and correspond to the plurality of unit pixels PX1 to PX4, respectively, in the pixel block 110.

The color separation element 240 may include a color filter. The color filter may include a red filter, a green filter, a blue filter, a cyan filter, a yellow filter, a magenta filter, a white filter, a black filter, or an IR cutoff filter, or combinations thereof. In the first embodiment, one pixel block 110 may include the color separation element 240 which is monochromatic, for example, a monochromatic color filter. Thus, the plurality of unit pixels PX1 to PX4 in the pixel block 110 may sense the same color.

The light focusing element 250 may include a digital lens or a hemispherical lens. The first embodiment illustrates a case where the light focusing element 250 may be a hemispherical lens. One pixel block 110 may include the light focusing elements 250 corresponding to the unit pixels PX1 to PX4, respectively. In other words, in the pixel block 110, the number of the plurality of transfer transistors TX1 to TX4 and the number of the plurality of light focusing elements 250 may be the same with each other. For example, in the first embodiment, because the pixel block 110 includes four unit pixels PX1 to PX4, four light focusing elements 250 may be provided to correspond to the respective unit pixels PX1 to PX4. The center axis (or optical axis) of each of the plurality of light focusing elements 250 may be positioned between each of the plurality of transfer transistors TX1 to TX4 and the lag prevention structure 230.

As described above, in the image sensor in accordance with the first embodiment, since each of the plurality of pixel blocks 110 has the shape in which the plurality of unit pixels PX1 to PX4 share the photoelectric conversion element 210, it is easy to increase the fill factor of the photoelectric conversion element 210 and sensitivity can be improved as well.

Further, in the image sensor in accordance with the first embodiment, since the lag prevention structure 230 is disposed at the center of the photoelectric conversion element 210, it is possible to easily control the movement of the photocharges accumulated in the photoelectric conversion element 210 even though the size of the photoelectric conversion element 210 may be increased. Thus, an operation speed of the image sensor can be increased, the uniformity among the unit pixels PX1 to PX4 can be improved, and the occurrence of the lag can be prevented or reduced.

Figure 5:
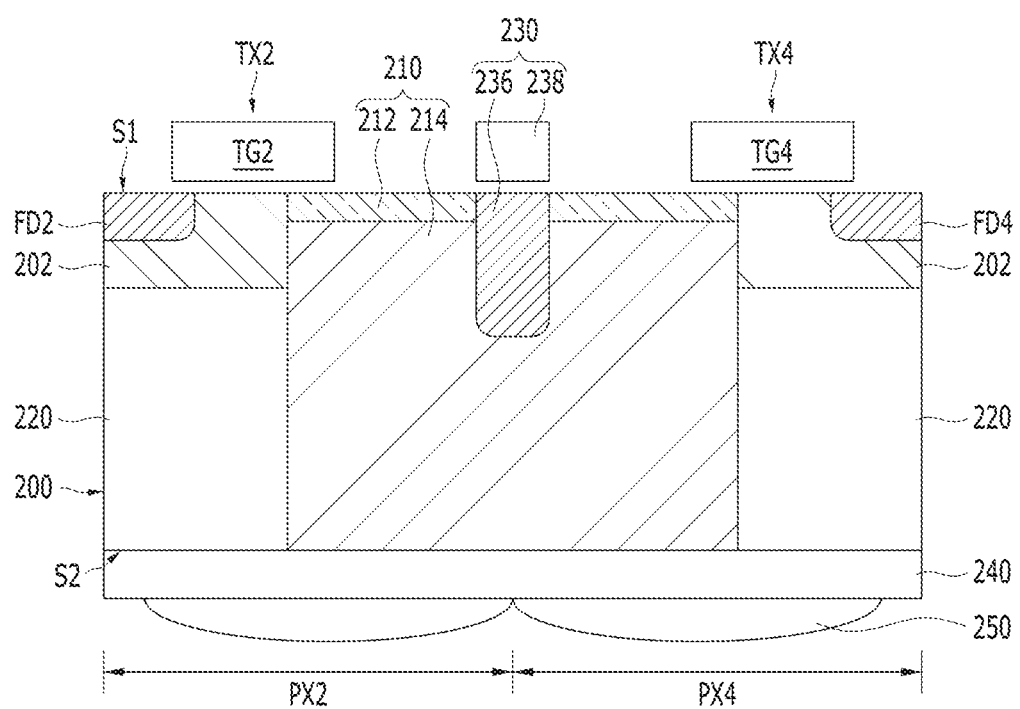
FIG. 5 is a cross-sectional view taken along the line I-I' of FIG. 2, illustrating a representation of an example of the pixel block of the image sensor based on an implementation of the disclosed technology.

FIG. 5 is a cross-sectional view taken along the line I-I' of FIG. 2, illustrating a representation of an example of the pixel block of the image sensor in accordance with the second embodiment. Hereinbelow, for the sake of convenience in explanation, the same reference symbols will be used for components the same as those of the image sensor in accordance with the first embodiment, and detailed descriptions will be made for only components different from those of the image sensor in accordance with the first embodiment.

As shown in FIGS. 2, 3 and 5, the pixel array (see the reference numeral 100 of FIGS. 1 and 6) of the image sensor in accordance with the second embodiment may include a plurality of pixel blocks 110 which are isolated by an isolation structure 220. Each of the plurality of pixel blocks 110 may include a photoelectric conversion element 210, a lag prevention structure 230 which is formed at the center of the photoelectric conversion element 210, a plurality of transfer transistors TX1 to TX4 which share the photoelectric conversion element 210, a plurality of floating diffusions FD1 to FD4 which correspond to the plurality of transfer transistors TX1 to TX4, respectively, and a driving section 260 which provides and outputs an image signal and an image reset signal corresponding to the photocharges generated in the photoelectric conversion element 210. The plurality of transfer transistors TX1 to TX4 and the lag prevention structure 230 may operate based on transfer signals TRF1 and TRF2. The transfer signals TRF1 and TRF2 may include a first transfer signal TRF1 which is applied to the plurality of transfer transistors TX1 to TX4 and a second transfer signal TRF2 which is applied to the lag prevention structure 230.

The lag prevention structure 230 may be positioned at the center of the photoelectric conversion element 210. The lag prevention structure 230 may include an impurity region 236 which is formed in the photoelectric conversion element 210 and has the shape of a vertically extending pillar and a gate 238 which is formed over the impurity region 236. The gate 238 may be formed over the first surface S1 of the substrate 200, and may be one which is formed together in a process for forming pixel transistors. The gate 238 may have a structure in which a gate dielectric layer and a gate electrode are stacked. The gate 238 and the impurity region 236 may be brought into non-direct contact with each other. The second transfer signal TRF2 which has a negative voltage may be applied to the gate 238. The impurity region 236 which has a shape isolated from the gate 238 may include an N-type impurity doped into the substrate 200. This is to control the photocharges accumulated in the photoelectric conversion element 210 to move in the outward direction of the lag prevention structure 230 in response to the second transfer signal TRF2 which has a negative voltage. In order to ensure easy movement of photocharges to the respective transfer transistors TX1 to TX4, the thickness (or depth) of the impurity region 236 may be greater than the thickness of the first region 212 of the photoelectric conversion element 210 and may be equal to or smaller than one half of the entire thickness of the photoelectric conversion element 210.

While the second embodiment illustrates a case where the impurity region 236 may abut with the first surface S1 of the substrate 200 and has the shape of a vertically extending pillar, it is to be noted that the embodiment is not limited thereto. As a modification, while not shown in a drawing, the impurity region 236 may be formed in the lower part of the substrate 200 and may be abut with the second surface S2 of the substrate 200. The gate 238 may be formed over the second surface S2 of the substrate 200, and a dielectric layer which covers the gate 238 may be formed on the second surface S2 of the substrate 200 (see FIG. 4B).

As described above, in the image sensor in accordance with the second embodiment, since each of the plurality of pixel blocks 110 has the shape in which the plurality of unit pixels PX1 to PX4 share the photoelectric conversion element 210, it is easy to increase the fill factor of the photoelectric conversion element 210 and sensitivity may be improved.

Further, in the image sensor in accordance with the second embodiment, since the lag prevention structure 230 may be disposed at the center of the photoelectric conversion element 210, it is possible to easily control the movement of the photocharges accumulated in the photoelectric conversion element 210 even though the size of the photoelectric conversion element 210 may be increased. Thus, an operation speed of the image sensor can be increased, the uniformity among the unit pixels PX1 to PX4 can be improved, and the occurrence of the lag can be prevented or reduced.

Figure 6:
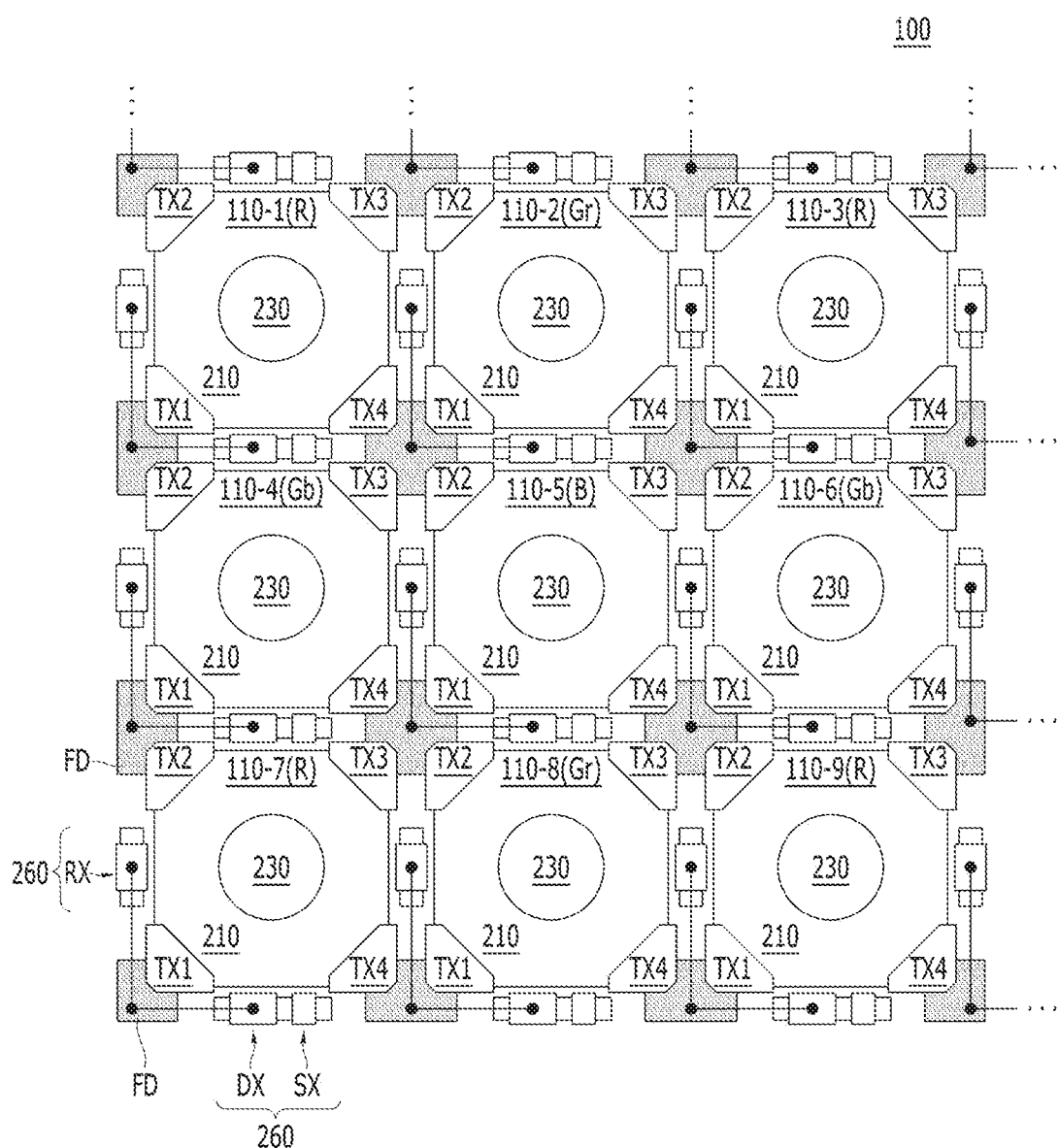
FIG. 6 is a top view illustrating a representation of an example of a portion of the pixel array of an image sensor based on an implementation of the disclosed technology.

FIG. 6 is a top view illustrating a representation of an example of a portion of the pixel array of an image sensor in accordance with an embodiment.

As shown in FIG. 6, the image sensor in accordance with the embodiment may include a pixel array 100 in which a plurality of pixel blocks 110-1 to 110-9 are arranged in the form of a matrix including rows and columns. For reference, FIG. 6 illustrates a case where nine pixel blocks 110-1 to 110-9 are arranged in the form of a 3×3 matrix.

Also, the image sensor in accordance with the embodiment may include a color filter array corresponding to the plurality of pixel blocks 110-1 to 110-9. The color filter array may include color filters for desired colors (e.g., red, green and blue). One implementation of the color filter array may be a Bayer pattern, and each of the plurality of pixel blocks 110-1 to 110-9 may include a monochromatic color filter. For example, a first pixel block 110-1, a third pixel block 110-3, a seventh pixel block 110-7 and a ninth pixel block 110-9 may include red filters R. A second pixel block 110-2, a fourth pixel block 110-4, a sixth pixel block 110-6 and an eighth pixel block 110-8 may include green filters Gr and Gb. A fifth pixel block 110-5 may include a blue filter B.

The image sensor shown in FIG. 6 illustrate that a floating diffusion FD may be shared by multiple pixel blocks 110. Among the plurality of pixel blocks 110-1 to 110-9, four pixel blocks 110 which are positioned adjacent to one another may share one floating diffusion FD. The four pixel blocks 110 sharing one floating diffusion FD are located adjacent to each other in first and second oblique directions that cross each other to surround the floating diffusion FD. With respect to a floating diffusion FD which is shared by fourth pixel blocks 110, lag prevention structures 230 in the respective pixel blocks 110 may be positioned symmetrically. The floating diffusions FDs located at corners of each pixel block are electrically coupled to different driving sections 260, respectively. Referring to FIG. 3, in each pixel block 110 among the plurality of pixel blocks 110-1 to 110-9, a floating diffusion FD coupled to a first transfer transistor TX1 may be electrically coupled with a driving section 260 of the corresponding pixel block 110. For example, the floating diffusion FD coupled to the first transfer transistor TX1 of the pixel block 110-5 may be electrically coupled with the driving section 260 which is located on a side, for example, a left side in the implementation shown in FIG. 6, of the pixel block 110-5. The floating diffusions FDs coupled to a second transfer transistor TX2 to a fourth transfer transistor TX4 of the pixel block 110-5, respectively, may be electrically coupled to driving sections 260 of other pixels blocks 110 adjacent to the corresponding pixel block 110.

For example, the first transfer transistor TX1 of the fifth pixel block 110-5 which is positioned at the center of the pixel array 100 may share a floating diffusion FD with the fourth transfer transistor TX4 of the fourth pixel block 110-4, the third transfer transistor TX3 of the seventh pixel block 110-7 and the second transfer transistor TX2 of the eighth pixel block 110-8. The first transfer transistor TX1 of the fifth pixel block 110-5, the fourth transfer transistor TX4 of the fourth pixel block 110-4, the third transfer transistor TX3 of the seventh pixel block 110-7 and the second transfer transistor TX2 of the eighth pixel block 110-8, which share the floating diffusion FD, may output output signals by using the driving section 260 of the fifth pixel block 110-5.

The second transfer transistor TX2 of the fifth pixel block 110-5 may share a floating diffusion FD with the fourth transfer transistor TX4 of the first pixel block 110-1, the first transfer transistor TX1 of the second pixel block 110-2 and the third transfer transistor TX3 of the fourth pixel block 110-4. The second transfer transistor TX2 of the fifth pixel block 110-5, the fourth transfer transistor TX4 of the first pixel block 110-1, the first transfer transistor TX1 of the second pixel block 110-2 and the third transfer transistor TX3 of the fourth pixel block 110-4 which share the floating diffusion FD may output output signals by using the driving section 260 of the second pixel block 110-2.

The third transfer transistor TX3 of the fifth pixel block 110-5 may share a floating diffusion FD with the fourth transfer transistor TX4 of the second pixel block 110-2, the first transfer transistor TX1 of the third pixel block 110-3 and the second transfer transistor TX2 of the sixth pixel block 110-6. The third transfer transistor TX3 of the fifth pixel block 110-5, the fourth transfer transistor TX4 of the second pixel block 110-2, the first transfer transistor TX1 of the third pixel block 110-3 and the second transfer transistor TX2 of the sixth pixel block 110-6 which share the floating diffusion FD may output output signals by using the driving section 260 of the third pixel block 110-3.

The fourth transfer transistor TX4 of the fifth pixel block 110-5 may share a floating diffusion FD with the first transfer transistor TX1 of the sixth pixel block 110-6, the third transfer transistor TX3 of the eighth pixel block 110-8 and the second transfer transistor TX2 of the ninth pixel block 110-9. The fourth transfer transistor TX4 of the fifth pixel block 110-5, the first transfer transistor TX1 of the sixth pixel block 110-6, the third transfer transistor TX3 of the eighth pixel block 110-8 and the second transfer transistor TX2 of the ninth pixel block 110-9 which share the floating diffusion FD may output output signals by using the driving section 260 of the sixth pixel block 110-6.

As described above, since the plurality of floating diffusions FD corresponding to the plurality of transfer transistors TX1 to TX4, respectively, which share photoelectric conversion elements 210 are electrically coupled with the driving sections 260, respectively, of adjacent pixel blocks 110-1 to 110-9, the plurality of transfer transistors TX1 to TX4 which share the photoelectric conversion elements 210 may operate together with one another, and through this, an operation speed may be increased.

Moreover, since the plurality of pixel blocks 110-1 to 110-9 share the floating diffusions FD, the high integration of the image sensor can be made possible.

The image sensor in accordance with the above-described embodiments can be used in various electronic devices or systems. Hereafter, a case in which the image sensor in accordance with the embodiments is applied to a camera will be described with reference to FIG. 7.

Figure 7:
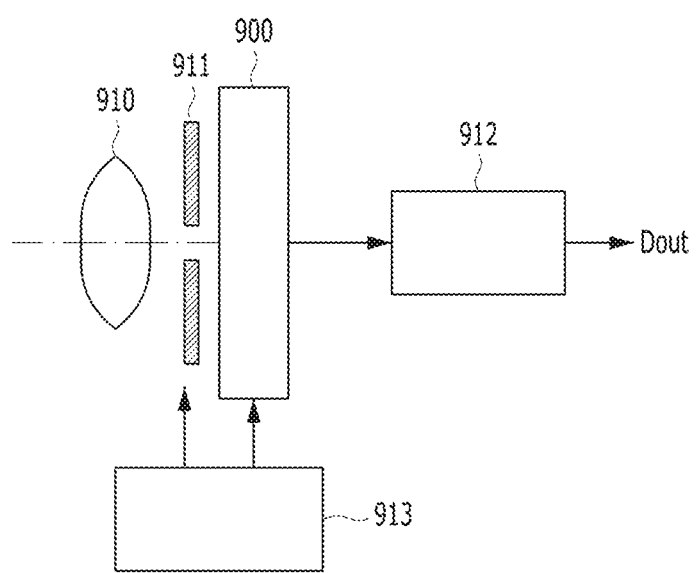
FIG. 7 is a diagram schematically illustrating a representation of an example of an electronic device including an image sensor based on an embodiment of the disclosed technology.

FIG. 7 is a diagram schematically illustrating a representation of an example of an electronic device including the image sensor based on an embodiment of the disclosed technology.

Referring to FIG. 7, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

In the present technology, since a plurality of transfer transistors share a photoelectric conversion element, the fill factor of the photoelectric conversion element may be easily increased, and sensitivity may be improved.

Also, since a lag prevention structure which is formed at the center of the photoelectric conversion element is included, the movement of the photocharges accumulated in the photoelectric conversion element may be easily controlled even though the size of the photoelectric conversion element is increased.

Moreover, because the plurality of transfer transistors and the lag prevention structure operate based on transfer signals, an operation speed may be increased and the high integration of an image sensor is easy.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor comprising:
   a photoelectric conversion element structured to receive incident light and convert the received light into electric charges;
   a monochromatic color separation element overlapping with the photoelectric conversion element;
   a plurality of light focusing elements formed over the color separation element;
   a plurality of transfer transistors electrically coupled to the photoelectric conversion element to respond to a transfer signal to selectively transfer the electric charges out of the photoelectric conversion element; and
   a lag prevention structure formed at a center of the photoelectric conversion element and structured to receive the transfer signal to operate together with the plurality of transfer transistors to facilitate transfer the electric charges out of the photoelectric conversion element,
   wherein the lag prevention structure includes an impurity region and an ohmic contact layer, and
   wherein the impurity region is formed in the photoelectric conversion element, and the ohmic contact layer is formed over the impurity region, and
   wherein the number of the plurality of light focusing elements is the same as the number of the plurality of transfer transistors.

2. The image sensor according to claim 1, wherein the transfer signal includes a first transfer signal which is applied to the plurality of transfer transistors and a second transfer signal which is applied to the lag prevention structure, and the first transfer signal and the second transfer signal have different polarities from each other.

3. The image sensor according to claim 1, wherein a planar shape of the lag prevention structure is symmetrical with respect to the center of the photoelectric conversion element.

4. The image sensor according to claim 1, wherein the impurity region has a pillar shape.

5. The image sensor according to claim 4,
wherein the impurity region includes a P-type impurity region.

6. The image sensor according to claim 4,
wherein the impurity region includes an N-type impurity region, and
wherein the lag prevention structure further includes a gate which is formed over the N-type impurity region.

7. The image sensor according to claim 1, the plurality of transfer transistors is positioned at corners of the photoelectric conversion element.

8. An image sensor comprising:
a plurality of pixel blocks isolated by an isolation structure,
each of the plurality of pixel blocks comprising:
a substrate having a first surface and a second surface that are on opposite sides of the substrate, and including a photoelectric conversion element formed in the substrate;
a monochromatic color separation element formed over the second surface of the substrate, and overlapping with the photoelectric conversion element;
a plurality of light focusing elements formed over the color separation element;
a plurality of transfer transistors formed over the first surface of the substrate, and coupled to the photoelectric conversion element; and
a lag prevention structure formed in the photoelectric conversion element, and including an impurity region which is positioned at a center of the photoelectric conversion element,
wherein the lag prevention structure further includes an ohmic contact layer,
wherein the impurity region is formed in the photoelectric conversion element, and the ohmic contact layer is formed over the impurity region, and
wherein the number of the plurality of light focusing elements is the same as the number of the plurality of transfer transistors.

9. The image sensor according to claim 8, wherein the lag prevention structure has the shape of a vertically extending pillar, and is brought into contact with the first surface of the substrate or the second surface of the substrate.

10. The image sensor according to claim 8, wherein the impurity region includes a P-type impurity region.

11. The image sensor according to claim 8,
wherein the impurity region includes an N-type impurity region, and
wherein the lag prevention structure further includes a gate which is formed over the N-type impurity region.

12. The image sensor according to claim 8, wherein the plurality of transfer transistors is positioned symmetrically to one another with respect to the lag prevention structure.

13. The image sensor according to claim 8, wherein each of the plurality of pixel blocks further comprises:
a plurality of floating diffusions electrically connected to the plurality of transfer transistors, respectively; and
a driving section electrically coupled to at least one of the plurality of floating diffusions and structured to output an output signal corresponding to photocharges generated in the photoelectric conversion element.

14. The image sensor according to claim 13,
wherein the driving section of a corresponding pixel block is electrically coupled with a first floating diffusion among the plurality of floating diffusions in the corresponding pixel block, and
wherein remaining floating diffusions except the first floating diffusion in the corresponding pixel block are electrically coupled to driving sections of other pixel blocks adjacent to the corresponding pixel block.

15. An image sensor comprising:
a plurality of pixel blocks isolated by an isolation structure and including a first pixel block to a fourth pixel block which are positioned adjacent to one another among the plurality of pixel blocks and share a first floating diffusion, wherein each of the first pixel block to the fourth pixel block comprises:
a photoelectric conversion element;
a lag prevention structure formed at a center of the photoelectric conversion element; and
a plurality of transfer transistors sharing the photoelectric conversion element, and
wherein the first floating diffusion is electrically coupled to any one of the plurality of transfer transistors in each of the first pixel block to the fourth pixel block.

16. The image sensor according to claim 15, further comprising:
a color filter array formed to correspond to the plurality of pixel blocks, the color filter array including a Bayer pattern.

17. The image sensor according to claim 15, wherein the lag prevention structures of the first pixel block to the fourth pixel block are positioned symmetrically to one another with respect to the first floating diffusion.

18. The image sensor according to claim 15, wherein the first pixel block to the fourth pixel block surround the first floating diffusion and any two adjacent pixel blocks of the first pixel block to the fourth pixel block further share an additional floating diffusion.

* * * * *